United States Patent
Ikeda

(10) Patent No.: US 7,343,259 B2
(45) Date of Patent: Mar. 11, 2008

(54) TEST APPARATUS AND PROGRAM THEREFOR

(75) Inventor: Naohiro Ikeda, Tokyo (JP)

(73) Assignee: Advantest Corporation, Tokyo (JP)

( * ) Notice: Subject to any disclaimer, the term of this patent is extended or adjusted under 35 U.S.C. 154(b) by 29 days.

(21) Appl. No.: 11/115,950

(22) Filed: Apr. 27, 2005

(65) Prior Publication Data

US 2006/0241885 A1    Oct. 26, 2006

(30) Foreign Application Priority Data

Apr. 25, 2005   (JP) ............................. 2005-126893

(51) Int. Cl.
*G01R 27/20* (2006.01)
(52) U.S. Cl. .................................................. 702/120
(58) Field of Classification Search ................ 702/120, 702/104
See application file for complete search history.

(56) References Cited

U.S. PATENT DOCUMENTS

| 2002/0049554 | A1* | 4/2002 | Miller | 702/104 |
| 2003/0101015 | A1* | 5/2003 | Douskey et al. | 702/120 |

FOREIGN PATENT DOCUMENTS

| JP | 10-19980 | 1/1998 |
| JP | 11-190760 | 7/1999 |
| JP | 2000-131388 | 5/2000 |
| JP | 2000-147069 | 5/2000 |
| JP | 2002-139556 | 5/2002 |
| JP | 2003-156527 | 5/2003 |
| JP | 2004-212291 | 7/2004 |
| JP | 2005-91038 | 4/2005 |

OTHER PUBLICATIONS

International Search Report issued in International Appl. No. PCT/JP2006/308327 mailed on Jul. 4, 2006, 3 pages.

* cited by examiner

*Primary Examiner*—Michael Nghiem
*Assistant Examiner*—Xiuqin Sun
(74) *Attorney, Agent, or Firm*—Osha Liang LLP

(57) ABSTRACT

There is provided a test apparatus having a plurality of test modules for supplying test patterns used in testing devices under test to the devices corresponding to a given timing signal, a reference clock generating section for generating a reference clock, a plurality of timing supply sections, provided corresponding to the plurality of test modules, for generating the timing signal corresponding to the reference clock and supplying the timing signal to the corresponding test module, respectively, and a control section for controlling timing for outputting the timing signal output by the timing supply section so that timing of the respective test patterns output by the plurality of test modules is practically equalized based on a test module delay of each test module until when it outputs the test pattern after receiving the timing signal.

15 Claims, 9 Drawing Sheets

①: OFFSET DELAY OF TIMING SUPPLY SECTION

②: TRANSMISSION DELAY IN WHOLE SYSTEM

③: DELAY IN TEST MODULE

④: DELAY TO BE SET IN TIMING SUPPLY SECTION

MTXDATA_VENDOR ID_MODULE ID.data.

| TEST MODULE 1 | |
|---|---|
| PATH NAME | SET VALUE |
| RCNT_DM | 164 |
| PSTA_DM | 81 |
| ⋮ | ⋮ |

| TEST MODULE 2 | |
|---|---|
| PATH NAME | SET VALUE |
| RCNT_DM | 204 |
| PSTA_DM | 121 |
| ⋮ | ⋮ |

SYSTEM CONFIGURATION INFORMATION

MODULE LIST PER PORT

| PORT | TEST MODULE ||
| | VENDOR ID | MODULE ID |
|---|---|---|
| 0 | 1 | 4 |
| 1 | 1 | 4 |
| 2 | 1 | 4 |
| 3 | 0 | 0 |
| ⋮ | ⋮ | ⋮ |
| 94 | 0 | 0 |
| 95 | 1 | 8 |

LIST OF TYPE OF MODULE

| No | VENDOR ID | MODULE ID |
|---|---|---|
| 0 | 1 | 4 |
| 1 | 1 | 8 |

SETTING LIST PER TYPE OF MODULE

| PATH NAME | MODULE No. ||
| | 0 | 1 |
|---|---|---|
| RCNT_DM | 164 | 204 |
| PSTA_DM | 81 | 121 |
| ⋮ | ⋮ | ⋮ |
| MATCH_COUNT | 143 | −1 |
| ⋮ | ⋮ | ⋮ |

*FIG. 7*

TEST APPARATUS AND PROGRAM THEREFOR

BACKGROUND OF THE INVENTION

1. Field of the Invention

The present invention relates to a test apparatus for testing devices under test such as a semiconductor device and to a program for operating the test apparatus. Further, the present application relates to the following application, the contents of which are incorporated herein by reference if applicable.

Japanese Patent application No. 2005-126893
Filed on Apr. 25, 2005

2. Description of Related Art

Conventionally, a test apparatus for testing devices under test (abbreviated as DUT hereinafter) tests the DUTs by outputting a plurality of signals thereto. At this time, the respective output signals must be controlled so that their phase difference from reference phase coincide each other.

The conventional test apparatus is provided with a plurality of test modules and outputs the plurality of output signals from those test modules. Still more, it is provided with a variable delay circuit at an output port of each test module to adjust the phase of the plurality of output signals.

The variable delay circuit may be readily installed in the conventional test apparatus because the test modules of the same type are mounted and the configuration of the mounted test modules is fixed.

However, the general-purposeness of the conventional test apparatus is low because the configuration of the test modules is fixed. Then, there has been proposed a test apparatus that permits the configuration of test modules to be changed and plural types of test modules to be used in parallel for example.

However, when the configuration of test modules is changed, phases of output signals of the test modules must be adjusted anew because a signal transmission delay differs per test module. Still more, when a plurality of types of test modules is used, phase of output signal must be adjusted for each test module because a transmission delay differs in each test module.

Accordingly, it is an object of the invention to provide a test apparatus and a program capable of solving the above-mentioned problems. This object may be achieved by combining features described in independent claims of the invention. Dependent claims specify further preferable embodiments of the invention.

SUMMARY OF INVENTION

In order to solve the above-mentioned problems, according to a first aspect of the invention, there is provided a test apparatus for testing DUTs, having:

a plurality of test modules for supplying test patterns used in testing the DUTs to the DUTs corresponding to a given timing signal;

a reference clock generating section for generating a reference clock;

a plurality of timing supply sections, provided corresponding to the plurality of test modules, for generating the timing signal corresponding to the reference clock and supplying the timing signal to the corresponding test modules, respectively; and a control section for controlling timing for outputting the timing signals output by the respective timing supply sections so that timings of the respective test patterns output by the plurality of test modules are practically equalized based on a test module delay of the respective test modules until when they output the test pattern after receiving the timing signal.

Preferably, the timing supply section has a delay circuit section for generating the timing signal by delaying the reference clock and the control section controls a delay set value in each delay circuit section based on the test module delay of the respective test modules and on an offset delay of the delay circuit section corresponding to the test module.

Preferably, the control section has a system configuration storage section for storing system configuration information specifying types of the respective test modules and types of the timing supply sections corresponding to each test module in advance, a module information storage section for storing the test module delay per type of the test module and the offset delay per type of the timing supply section and an operating section for detecting the test module delay of each test module and the offset delay of the timing supply section corresponding to the test module from the module information storage section based on the system configuration information stored in the system configuration storage section and for calculating the delay set value to be set in each delay circuit section based on the detected test module delay and offset delay.

Still more, the operating section may calculate the delay set value to be set in each delay circuit section based further on a wiring delay in a wire connecting each test module with the timing supply section corresponding to the test module.

Preferably, the delay circuit section has a plurality of cascade-connected flip-flops for receiving the timing signal and passing the timing signal sequentially to the next stage corresponding to the reference clock and a timing signal selecting section for receiving the timing signals output by the respective flip-flops and for selecting either one among the plurality of received timing signals to supply to the test module.

The operating section may calculate the delay set value for controlling the selection of the corresponding timing signal selecting section that selects either one of the timing signals per each test module.

The control section may also have a delay setting section for controlling the selection of each timing signal selecting section that selects either one of the timing signals based on each of the delay set value. The delay setting section may judge to which test module each timing supply section corresponds based on the system configuration information and sets the delay set value calculated by the operating section per each test module for the timing supply section corresponding to each test module.

Preferably, each test module has a plurality of test pattern paths for outputting the test patterns, each timing supply section has the delay circuit section per each test pattern path of the corresponding test module and the control section controls the delay set value in each delay circuit section based on the test module delay in the corresponding test pattern path.

The module information storage section may store the test module delay per each test pattern path of each test modules and the operating section may detect the test module delay per each test pattern path of each test module and the offset delay of the timing supply section corresponding to the test module from the module information storage section and may calculate the delay set value to be set in each delay circuit section based on the detected test module delay and the offset delay.

When the system configuration information stored in the system configuration storage section is changed, the operating section may calculate a delay set value to be set in each delay circuit section anew based on the changed system configuration information.

According to a second aspect of the invention, there is provided a program for operating a test apparatus for testing DUTs as:
- a plurality of test modules for supplying test patterns used in testing the DUT to the DUT corresponding to a given timing signal;
- a reference clock generating section for generating a reference clock;
- a plurality of timing supply sections, provided correspondingly to the plurality of test modules, for generating the timing signal corresponding to the reference clock and supplying the timing signal to the corresponding test module, respectively; and
- a control section for controlling timing for outputting the timing signal output by the timing supply section so that timing of the respective test patterns output by the plurality of test modules is practically equalized based on each test module delay until when each test module outputs the test pattern after receiving the timing signal.

According to a third aspect of the invention, there is provided a test apparatus for testing DUTs, having:
- a plurality of test modules for supplying test patterns used in testing the DUT to the DUT corresponding to a given timing signal and for generating a fail timing signal specifying whether or not the DUT is non-defective based on an output signal of the DUT;
- a reference clock generating section for generating a reference clock;
- a plurality of timing supply sections, provided correspondingly to the plurality of test modules, for generating the timing signal corresponding to the reference clock and supplying the timing signal to the corresponding test module, respectively;
- a plurality of return system circuits, provided in correspondence to the plurality of test modules, for receiving the fail timing signal output by the corresponding test module, delaying and inputting the fail timing signal to the timing supply section and generating the timing signal corresponding to the fail timing signal; and
- a control section for controlling timing of each return system circuit in outputting the fail timing signal so that timing when each fail timing signal output by the plurality of test modules is inputted to the timing supply section is practically equalized based on each test module delay until when each test module outputs the fail timing signal to the return system circuit after generating the fail timing signal.

Preferably, the return system circuit has a delay circuit section for delaying and outputting the fail timing signal and the control section controls a delay set value in each delay circuit section based on the test module delay of the respective test modules and on an offset delay of the delay circuit section corresponding to the test module.

According to a fourth aspect of the invention, there is provided a program for operating a test apparatus for testing DUTs as:
- a plurality of test modules for supplying test patterns used in testing the DUT to the DUT corresponding to a given timing signal and for generating a fail timing signal specifying whether or not the DUT is non-defective based on an output signal of the DUT;
- a reference clock generating section for generating a reference clock;
- a plurality of timing supply sections, provided correspondingly to the plurality of test modules, for generating the timing signal corresponding to the reference clock and supplying the timing signal to the corresponding test module, respectively;
- a plurality of return system circuits, provided in correspondence to the plurality of test modules, for receiving the fail timing signal output by the corresponding test module, delaying and inputting the fail timing signal to the timing supply section and generating the timing signal corresponding to the fail timing signal; and
- a control section for controlling timing of each return system circuit in outputting the fail timing signal so that timing when each fail timing signal output by the plurality of test modules is inputted to the timing supply section is practically equalized based on each test module delays until when each test module outputs the fail timing signal to the return system circuit after generating the fail timing signal.

It is noted that the summary of the invention does not necessarily describe all necessary features of the invention. The invention may also be a sub-combination of the features described above.

BRIEF DESCRIPTION OF THE DRAWINGS

FIG. 6 explains intermediate files generated by the operating section.

FIG. 7 explains the intermediate files generated by the operating section.

DETAILED DESCRIPTION OF THE INVENTION

The invention will now be described based on preferred embodiments, which do not intend to limit the scope of claims of the invention, but exemplify the invention. All of the features and the combinations thereof described in the embodiments are not necessarily essential to the invention.

Figure 1:
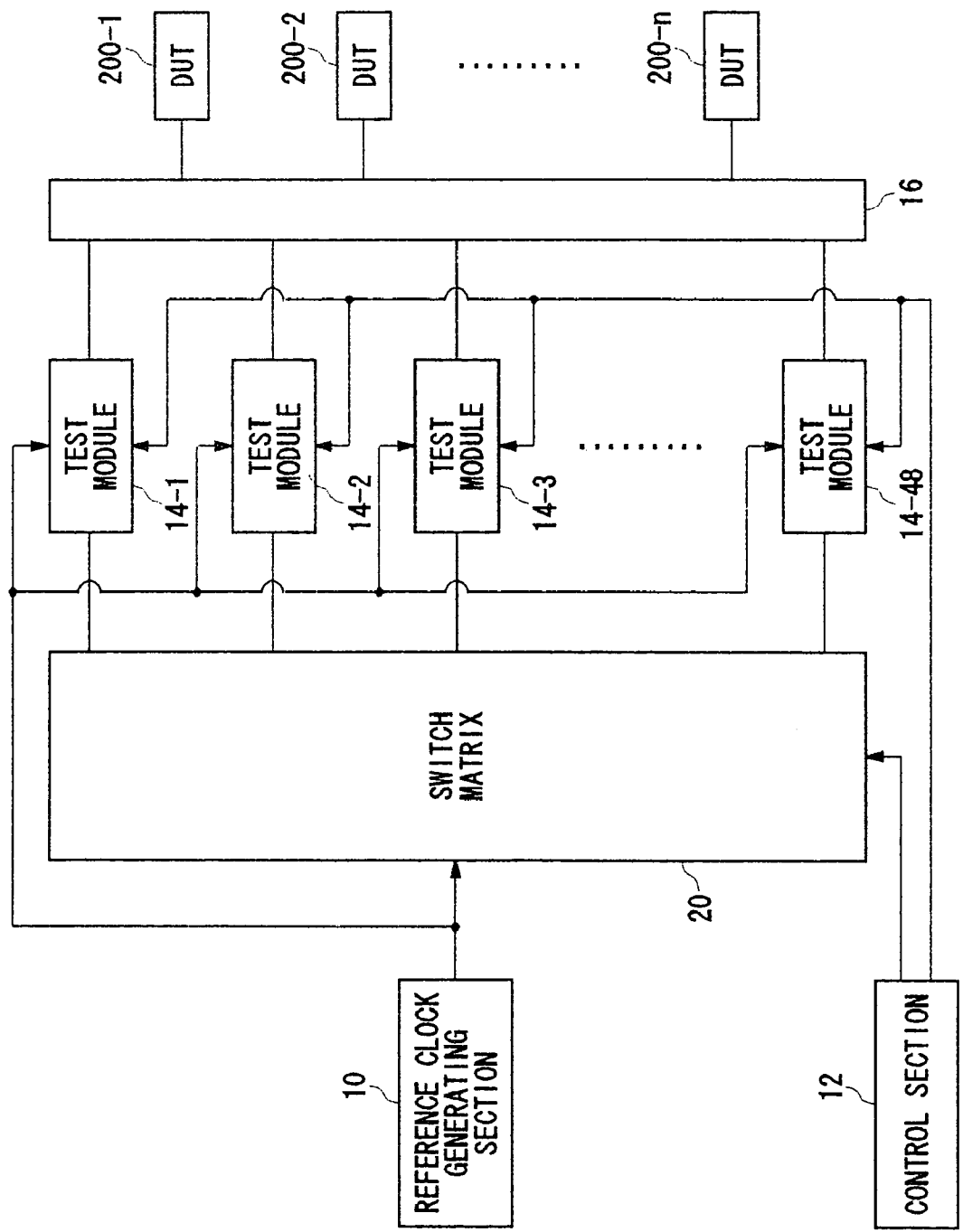
FIG. 1 is a diagram showing one exemplary configuration of a test apparatus according to one embodiment of the invention.

FIG. 1 is a diagram showing one exemplary configuration of a test apparatus 100 according to one embodiment of the invention. The test apparatus 100 tests a plurality of DUTs 200-1 through 200-n (generically denoted as 200 hereinafter) such as semiconductor circuits. The test apparatus 100 has a reference clock generating section 10, a control section 12, a plurality of test modules 14-1 through 14-48 (generically denoted as 14 hereinafter), a device contact section 16 and a switch matrix 20.

The device contact section 16 is a test head for mounting the plurality of DUTs 200 for example and electrically connects the plurality of test modules 14 with the plurality of DUTs 200. Each test module 14 is electrically connected with one or the plurality of DUTs 200. Each DUT 200 is also electrically connected with one or the plurality of test modules 14. For instance, the test modules 14 and the DUTs 200 have a predetermined number of input and output pins, respectively, so that the test modules 14 are connected with the DUTs 200 corresponding to the respective numbers of pins.

The test module 14 may be a module for supplying a given test pattern to the corresponding DUT 200. In the present embodiment, each test module 14 receives a test pattern from the control section 12 in advance and supplies it to the DUT 200 with timing corresponding to a timing signal given from the switch matrix 20. The test module 14 may judge whether or not the DUT 200 is non-defective based on a signal output by the DUT 200. In this case, the test module 14 may have a fail memory for storing failure data of the DUT 200 or may supply the failure data to the control section 12.

The reference clock generating section 10 generates a reference clock having a frequency set in advance. The respective structural components of the test apparatus 100 operate corresponding to the reference clock. The switch matrix 20 generates a plurality of timing signals having different phases based on the reference clock and supplies them to the respective test modules 14. That is, the switch matrix 20 controls operation timing of the respective test modules 14 by supplying the timing signals to the test modules 14.

The control section 12 controls the switch matrix 20 so that it supplies the timing signal of certain phase to the respective test modules 14. Still more, the control section 12 supplies test patterns to the respective test modules 14 beforehand. The control section 12 may be a host computer such as a workstation for example. The control section 12 may also have a plurality of host computers. In this case, the DUTs 200 are allocated to each host computer to control the test modules 14 connected with the allocated DUTs 200 and phases of the timing signal supplied to the test modules 14.

The test apparatus 100 also has a plurality of slots for loadably holding the test modules 14. The test apparatus 100 having such a structure conducts the test of the DUTs by using the arbitrary test modules 14.

Figure 2:
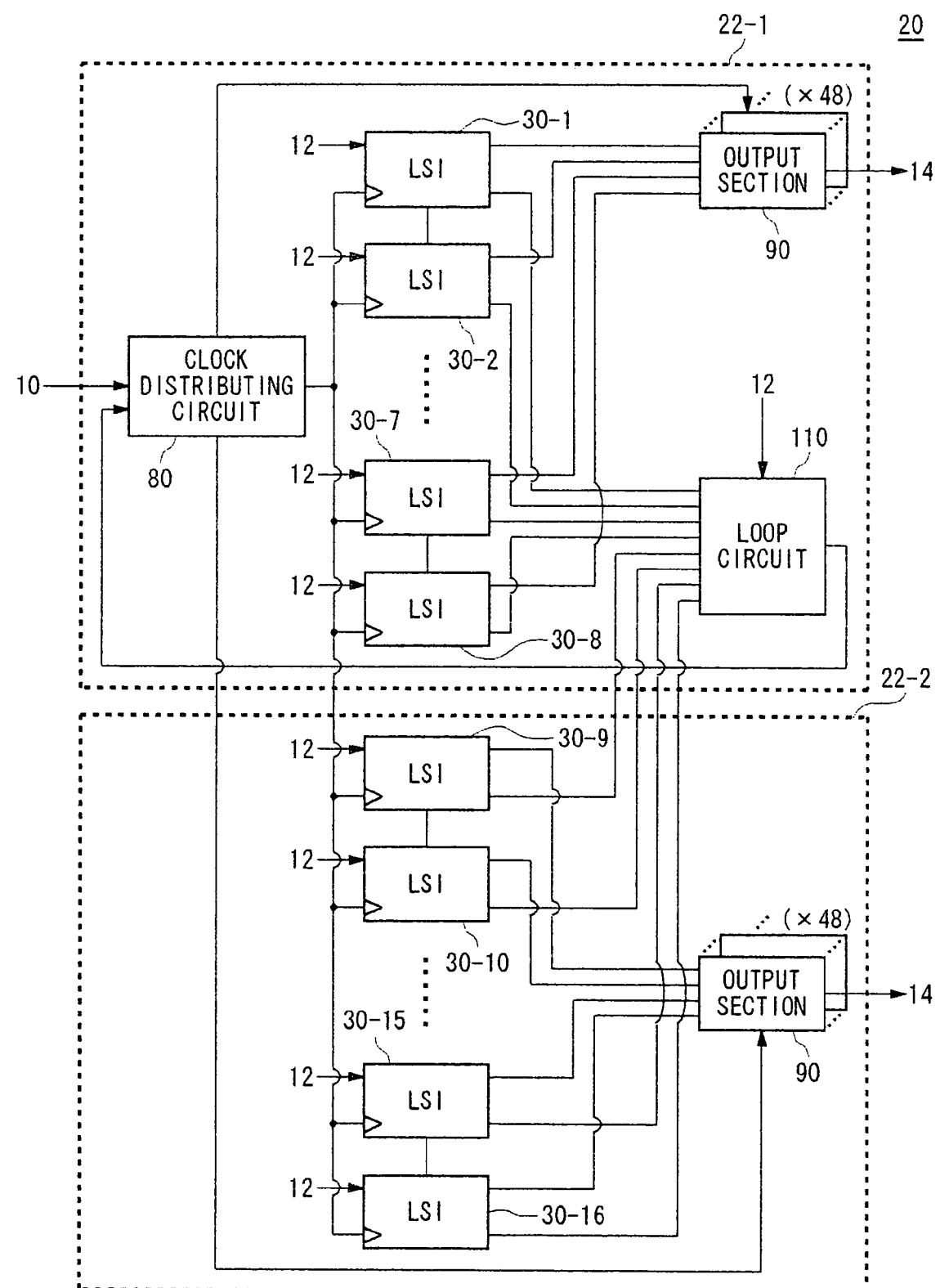
FIG. 2 is a diagram showing one exemplary configuration of a switch matrix.

FIG. 2 is a diagram showing one exemplary configuration of the switch matrix 20. The switch matrix 20 has a plurality of test boards 22-1 and 22-2 (generically denoted as 22 hereinafter). The test board 22 is provided with a reference clock distributing section 80, a plurality of timing supply sections 30-1 through 30-16 (generically denoted as 30 hereinafter), a plurality of output sections 90 and a loop circuit 110. The switch matrix 20 has a slot for loadably holding the test board 22 and is provided with the arbitrary test board 22.

The reference clock distributing section 80 receives the reference clock generated by the reference clock generating section 10 and distributes it to each component of the switch matrix 20. Based on the reference clock input as an input signal, the timing supply section 30 outputs the timing signals for testing the DUT 200. For instance, the timing supply section 30 supplies a timing signal specifying timing for applying the test pattern to the DUT 200, a timing signal specifying timing for starting the test of the DUT 200, a timing signal specifying timing for stopping the test of the DUT 200, a timing signal specifying timing for taking in the failure data of the DUT 200 and others to the test module 14 via the output section 90.

In the present embodiment, the timing supply section 30 generates the plurality of timing signals having different phases based on the inputted reference clock. Then, in the respective timing supply sections 30, the control section 12 switches the timing signal to be supplied to each test module 14 among the plurality of timing signals generated by the timing supply section 30. Thereby, the control section 12 can control the timing of each test module 14 in supplying the test pattern to the DUT 200 for example. The timing supply section 30 also outputs the reference clock used in generating the timing signal in synchronism with the timing signal.

Functions such as control of the timing for applying the test pattern to the DUT 200, control of the timing for starting the test of the DUT 200, control of timing for stopping the test of the DUT 200, control of the timing for taking in the failure data of the DUT 200 and others are allocated to the plurality of timing supply sections 30 in advance. The respective timing supply sections 30 are integrated circuits having the same configuration and have a circuit structure for carrying out all the functions described above when their operation mode is switched. The control section 12 controls the operation modes. The general-purposeness of the timing supply section 30 may be improved by constructing the respective timing supply sections 30 so as to have the same configuration as described above.

Further, depending on a number of pins of the timing supply section 30, there is a case when the number of input and output pins is insufficient when one timing supply section 30 is arranged so as to have a circuit structure capable of carrying out all the functions described above. In such a case, the insufficiency of the input and output pins may be eliminated by combining the plurality of timing supply sections 30. For instance, the test apparatus 100 may be operated by combining the timing supply section 30-1 with the timing supply section 30-2 as shown in FIG. 2. The control section 12 of this case operates the test apparatus 100 by allocating either one of the functions described above to the respective combination of the timing supply sections 30.

The plurality of output sections 90 is provided corresponding to the plurality of test modules 14. The output section 90 receives the timing signal from either one of the plurality of timing supply sections 30 and sends the received timing signal to the corresponding test module 14. The control section 12 controls the supply of the timing signal from either one of the timing supply sections 30 to the output section 90 based on the function of the respective test modules 14 and on the function of the respective timing supply sections 30.

Because the test apparatus 100 tests the DUTs 200 by using the plurality of timing supply sections 30 and the plurality of test modules 14, the signals must be synchronized in their interaction. The test apparatus 100 of the present embodiment adjusts the timing of the timing signals supplied from the timing supply section 30 to the test module 14 based on delays of signal paths in the switch matrix 20 and the test module 14 for outputting the output signal per each output signal outputted by the test module 14 to the DUT 200.

The loop circuit 110 is a circuit for measuring the delay in the timing supply section 30 by feeding back and inputting the timing signal outputted by the respective timing supply sections 30 to the timing supply sections 30 via the reference clock distributing section 80.

Figure 3:
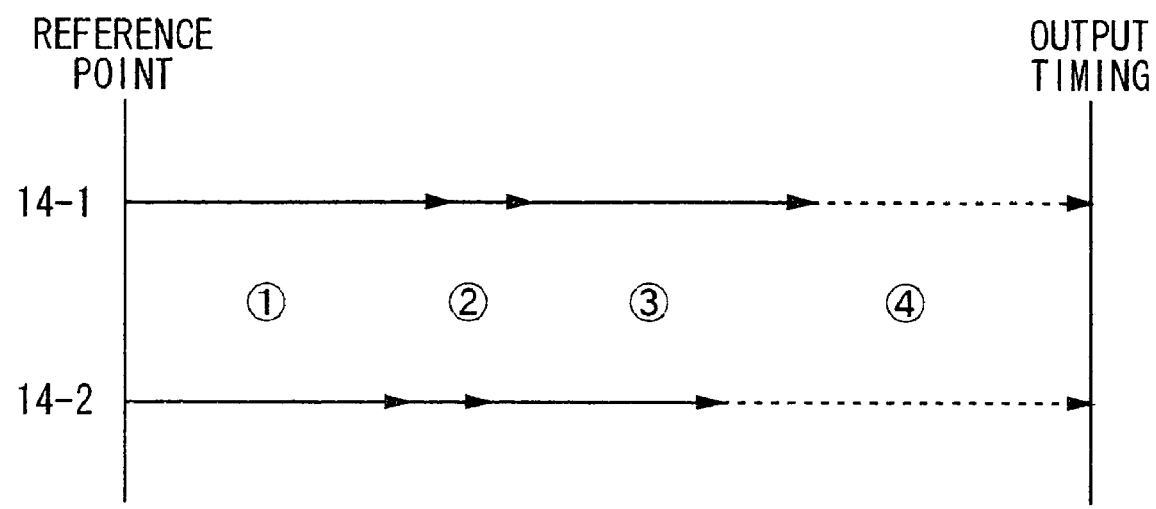
FIG. 3 is a chart showing output timing of output signals output by test modules.

FIG. 3 is a chart showing output timing of the output signals output by the test modules 14-1 and 14-2. The output timing of the output signals of the respective test modules 14 is determined by 1) an offset delay in the corresponding timing supply section 30, 2) a transmission delay in a whole system such as a signal line, 3) a delay in the test module 14 (referred to as a test module delay hereinafter), and 4) a delay set for the timing supply section 30. Here, the timing supply section 30 has a delay circuit section for generating the timing signal by delaying the given reference clock and a delay in the delay circuit section set in minimum will be defined as the offset delay. The transmission delay in the whole system is a wiring delay and others in transmitting a signal from the timing supply section 30 to the test module 14 in this case. The delay in the test module 14 is a delay time until when the test module 14 outputs the test pattern after receiving the timing signal.

Because the delays in 1) to 3) described above may be calculated beforehand from their designed and measured values, the timing of the respective output signals of the respective test modules 14 may be practically equalized by adjusting the delay in the timing supply section 30, provided that a desired output timing having a desired phase to a certain reference clock is given.

Based on an expected value of the output timing and the respective delays of 1) to 3), the control section 12 adjusts the delay in the respective timing supply sections 30 to control the timing for outputting the timing signal. Thereby, the control section 12 adjusts the output timing of the test pattern outputted by the respective test modules 14 to the desired output timing.

When it is required to eliminate dispersion of the output timings of the test patterns output by the respective test modules 14 and to adjust the timing to the equal output timing, the control section 12 may adjust the delay in the timing supply section 30 corresponding to the dispersion of the delays in 1) to 3) described above for the respective test patterns. At this time, when the delay in 2) is equal in the signal paths for the respective test patterns, the control section 12 may adjust the delay in the corresponding timing supply section 30 based on the test module delay in the respective test modules 14 and on the offset delay in the delay circuit section corresponding to the test module 14.

Figure 4:
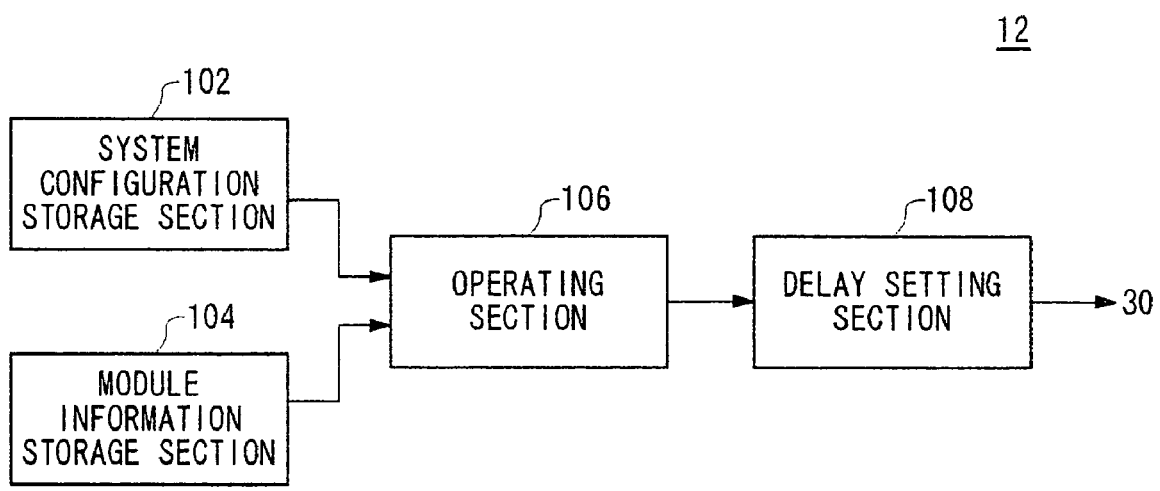
FIG. 4 is a diagram showing one exemplary configuration of a control section.

FIG. 4 is a diagram showing one exemplary configuration of the control section 12. The control section 12 has a system configuration storage section 102, a module information storage section 104, an operating section 106 and a delay setting section 108. The system configuration storage section 102 stores system configuration information specifying a type of the test module 14 provided in each slot and a type of the timing supply section 30 corresponding to each test module 14 in advance. That is, the system configuration storage section 102 stores the types of the test module 14 and the timing supply section 30 through which the respective output signals and the timing signals corresponding to the output signals pass.

The system configuration storage section 102 may also store the type of the test board 22 provided in the switch matrix 20 as the type of the timing supply section 30. The offset delay of the timing supply sections 30 provided in the same type of test boards 22 is practically equal.

The system configuration storage section 102 may also store system configuration information supplied from an user for example or may detect system configuration to generate system configuration information. In generating the system configuration information, each test module 14 and timing supply section 30 (or the test board 22) having information for identifying themselves inform the control section 12 of the identification information upon request from the control section 12. Still more, the control section 12 detects the test module 14 correlating with the timing supply section 30 and generates the system configuration information based on the correlation and the obtained identification information.

The module information storage section 104 stores the test module delay per each type of the test modules 14 and the offset delay per each type of the timing supply sections 30 in advance. When one test module 14 has a plurality of functions and has a plurality of test pattern paths for outputting the output signals per each function, the module information storage section 104 stores the test module delay per each function of the test module 14. In this case, the timing supply section 30 has a plurality of delay circuit sections in order to generate different timing signals per each function of the test modules 14.

Based on the system configuration information stored in the system configuration storage section 102 and the respective delays stored in the module information storage section 104, the operating section 106 calculates the delay set value to be set for the delay circuit section of the timing supply section 30 corresponding to each output signal. The detail of the operation of the operating section 106 will be described later with reference to FIG. 5.

The delay setting section 108 calls out the delay set value calculated by the operating section 106 for the delay circuit section of the respective timing supply sections 30 and sets it in the corresponding delay circuit section. Through such operations, the test apparatus 100 can output the respective output signals practically with the equal output timing.

Figure 5:
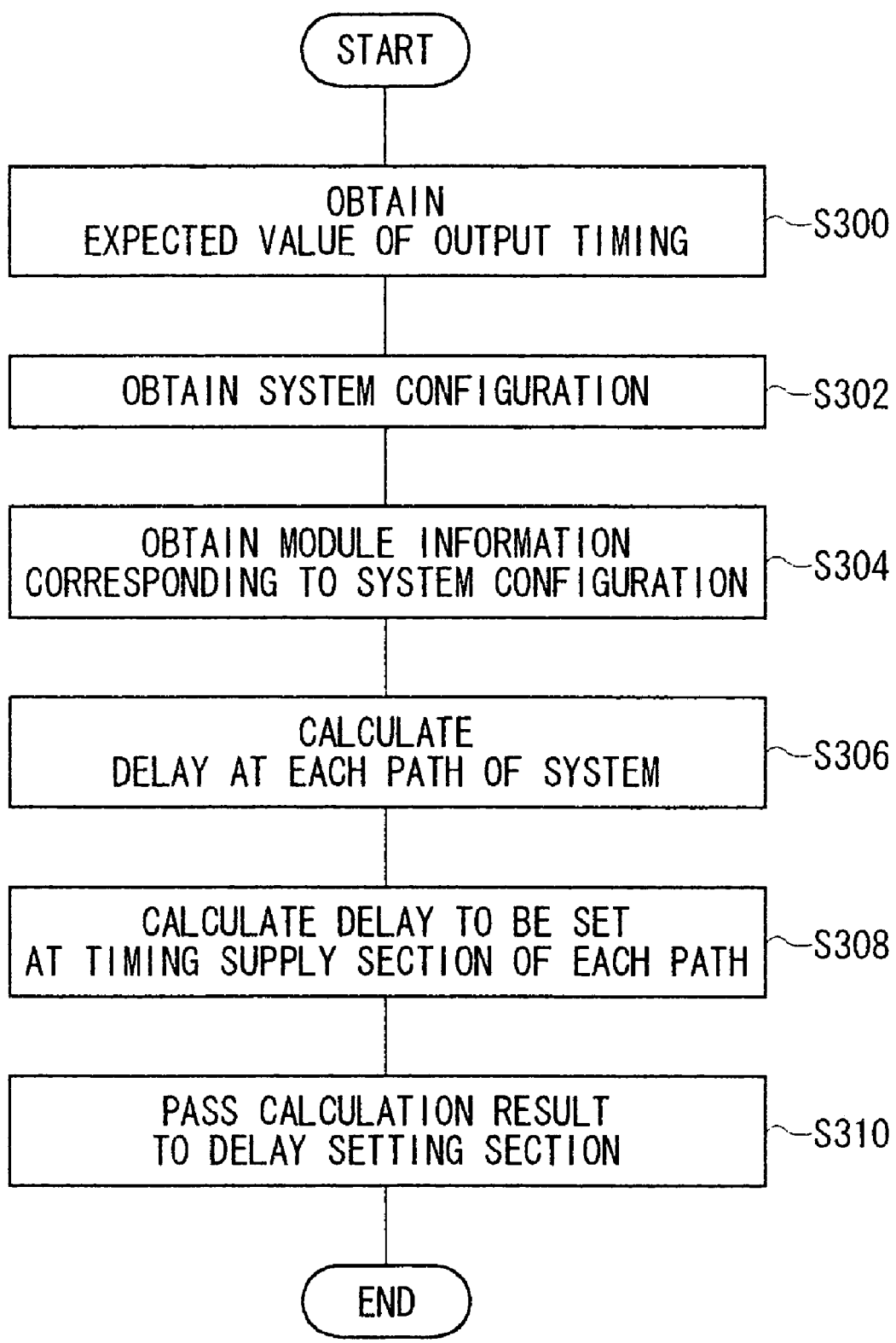
FIG. 5 is a flowchart showing one exemplary operation of an operating section.

FIG. 5 is a flowchart showing one exemplary operation of the operating section 106. The operating section 106 obtains an expected value of the output timing of the output signal of each test module 14 in Step S300. The user for example may give such expected value. Step 300 may be carried out at any time as far as it precedes Step S308. The operating section 106 also obtains the system configuration information from the system configuration storage section 102 in Step S302.

Then, based on the system configuration information, the operating section 106 detects the test module delay of each test module 14 and the offset delay of the timing supply section 30 corresponding to the test module 14 from the module information storage section 104 in Step S304. When the test module 14 has the plurality of functions, the operating section 106 detects the test module delay per each function of the test module 14.

The module information storage section 104 may also store the delay of the whole system and the operating section 106 may detect the system delay in Step S304. As for the system delay, the same value may be used for the respective output signals.

Next, based on each detected test module delay and offset delay, the operating section 106 calculates a delay in each path outputting the output signal in Step S306. For instance, the operating section 106 calculates the delay in each path by adding the test module delay of each test module 14, the offset delay in the corresponding timing supply section 30 and the system delay.

Then, based on the obtained expected value of the output timing and the delay of each path, the operating section 106 calculates the delay set value to be set in the delay circuit section of the timing supply section 30 in each path in Step S308. For instance, the operating section 106 calculates each delay set value based on a difference between the delay of expected value of the output timing to a predetermined reference point and the delay of each path.

Next, the operating section 106 passes each delay set value to the delay setting section 108 by correlating it with the delay circuit section of the timing supply section 30. Through such operations, the operating section 106 can calculate the delay set value for each delay circuit section in each timing supply section 30.

When the system configuration information stored in the system configuration storage section 102 is changed, added or updated, the operating section 106 may calculate a delay set value to be set in the delay circuit section of each timing supply section 30 anew based on the new system configuration information. When the type of the connected test module 14 is changed, the system configuration storage section 102 may obtain new system configuration information.

FIG. 6 explains intermediate files generated by the operating section 106. The operating section 106 calculates the delay set value of the timing supply section 30 per each function (per bus) of each test module 14 as described above. The operating section 106 generates a file correlating the functions contained in the test module 14 with the calculated delay set value per each test module 14. Preferably, a file name of the file includes Vendor ID and Test Module ID of the pertinent test module 14.

FIG. 7 explains the intermediate files generated by the operating section 106. In this case, it is assumed that each test module 14 is connected with the same test board 22 and that the offset delay in the respective timing supply sections 30 is equal.

Based on the system configuration information, the operating section 106 prepares a list of test modules 14 connected per each port. Here, the port is an output port in the switch matrix 20 and the delay circuit section of one timing supply section 30 is connected with one port for example. In the system configuration information, the test modules 14 are administered by their Vendor ID and Module ID.

Next, based on the module list, the operating section 106 generates a list of types of modules specifying the type of test modules 14 contained in the test modules 14 connected to the whole ports. At this time, the type of the test module 14 is administered by Test Module No. Because there are two types of test modules 14 in this case, 0 and 1 are given as Test Module No. in the list of the module type.

Then, the operating section 106 obtains information on the test module 14 contained in the list of the module type from the module information storage section 104 and calculates the delay set value per each function of the test module 14 contained in the list of the module type. At this time, the operating section 106 may generate the file explained with reference to FIG. 6.

Then, the operating section 106 generates a setting list correlating each function with the delay set value per type of the test module 14 connected to the port. Here, the operating section 106 gives −1 as the delay set value for a function not contained in each test module 14.

Then, in correspondence to the type of test module 14 connected to each port, the delay setting section 108 sets the delay set value specified in the setting list in the delay circuit section of the timing supply section 30 corresponding to each port.

Figure 8:
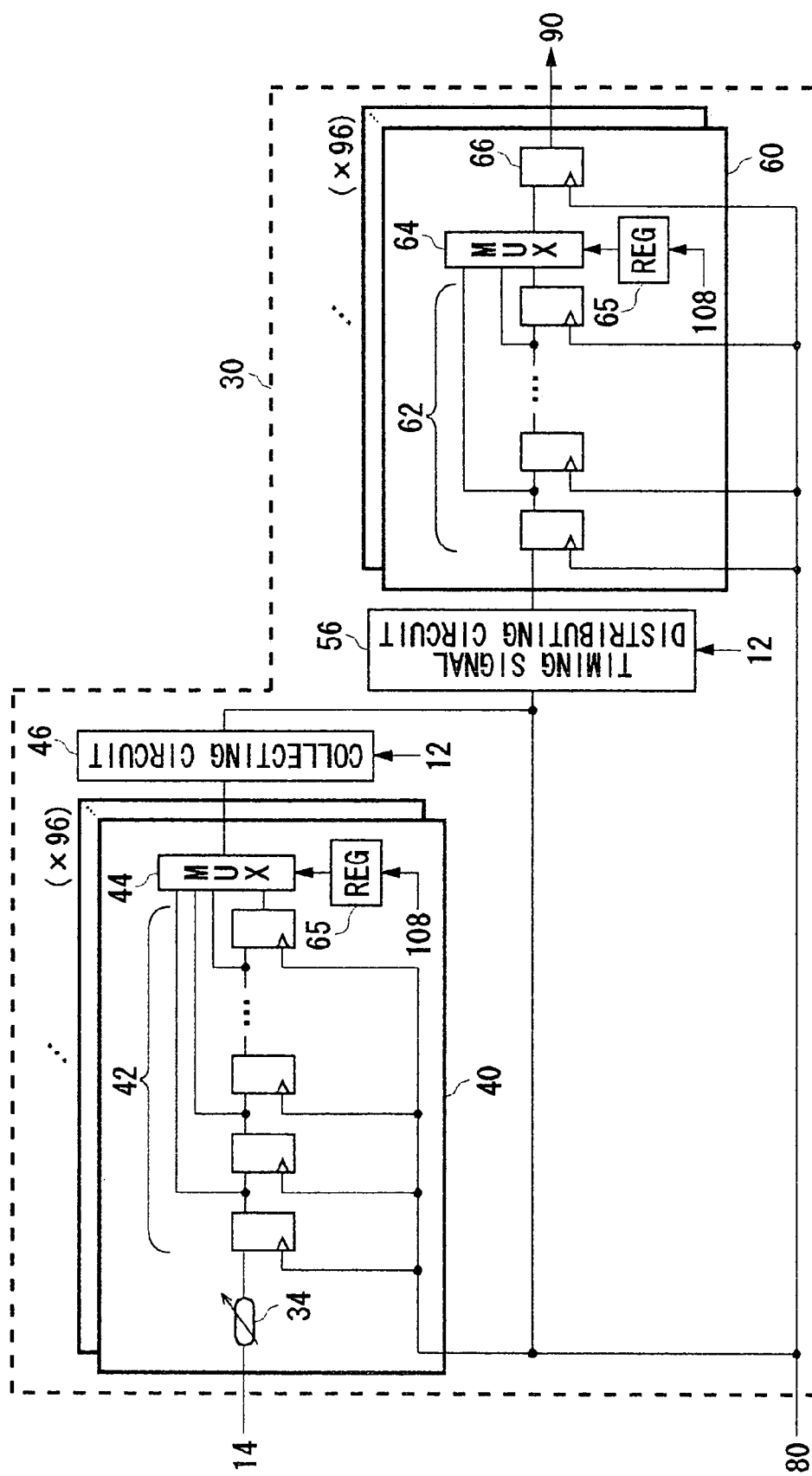
FIG. 8 is a diagram showing one exemplary configuration of a timing supply section.

FIG. 8 is a diagram showing one exemplary configuration of the timing supply section 30. The timing supply section 30 has a distribution circuit 56, a collection circuit 46, a plurality of return system circuits 40 and a plurality of delay circuit sections 60. The distribution circuit 56 supplies the given reference clock to the respective delay circuit sections 60. The plurality of delay circuit sections 60 is provided such that two each delay circuit section correspond to one output section 90 and supplies the timing signal to the corresponding output section 90. Each delay circuit section 60 has a plurality of cascade-connected flip-flops 62, a timing signal selecting section 64, a register 65 and a synchronization circuit 66.

The plurality of flip-flops 62 is a circuit for passing the reference clock received from the distribution circuit 56 sequentially to the next stage in synchronism with the reference clock. The timing signal selecting section 64 selects and outputs either signal among signals output from the respective flip-flops 62. The register 65 stores a set value for controlling the timing signal selecting section 64 in selecting the signal. Controlling the timing signal selecting section 64 in selecting the signal permits a signal having a desired phase to be selected among the signals whose phase sequentially changes with the resolution of frequency of the reference clock. The delay setting section 108 explained with reference to FIG. 4 controls the delay in the delay circuit section 60 by storing each delay set value in the corresponding register 65.

The synchronization circuit 66 outputs the signal selected by the timing signal selecting section 64 to the output section 90 as the timing signal. The synchronization circuit 66 synchronizes the timing signal output by the other delay circuit section 60 to the reference clock by outputting the timing signal corresponding to the given reference clock.

Receiving a signal from the test module 14 such as a fail timing signal specifying timing when a failure has occurred in an output pattern outputted by the DUT 200 from the plurality of corresponding test modules 14, each return system circuit 40 supplies the fail timing signal to the delay circuit section 60 via the collection circuit 46 and the distribution circuit 56. At this time, there is a case when phase of the fail timing signal is shifted in the respective return system circuits 40 due to the characteristics of each test module 14. That is, the time from when each test module 14 generates the fail timing signal till when each test module 14 supplies it to each return system circuit 40 may differ depending on the test modules 14.

There is a case when the test apparatus 100 controls the operation of the plurality of test modules 14 based on the signal supplied from the test module 14 to the timing supply section 30 like when the test apparatus 100 stops the application of the test pattern in the plurality of test modules 14 when a failure is detected in any one of the test modules 14 for example. In carrying out such operations, the test apparatus 100 cannot control the plurality of test modules 14 in synchronism if the time from when each test module 14 generates the fail timing signal till when each test module supplies it to each return system circuit 40 differs depending on the test modules 14. The control section 12 compensates the above-mentioned shift by controlling the plurality of return system circuits 40 so that the respective return system circuits 40 output the fail timing signals practically at the same timing.

In the present embodiment, each return system circuit 40 has a plurality of cascade-connected flip-flops 42 and a return signal selecting section 44. Each flip-flop of the plurality of flip-flops 42 receives the fail timing signal and passes it to the next stage sequentially in correspondence to the distributed reference clock.

The return signal selecting section 44 receives the fail timing signal output by each flip-flop 42 and selects either one fail timing signal among the plurality of received fail timing signals. Then, the return signal selecting section 44 adjusts timing for supplying the fail timing signal to the delay circuit section 60 by supplying the selected fail timing signal to the delay circuit section 60 via the collection circuit 46 and the distribution circuit 56.

Similarly to the setting of delay for the delay circuit section 60, the control section 12 may calculate a delay to be set for the return system circuit 40. For instance, the control section 12 may set a delay set value for each return system circuit 40 based on a test module delay of the corresponding test module 14, an offset delay of the return system circuit 40 and a transmission delay from the test module 14 to the return system circuit 40. In this case, the test module delay of the test module 14 may be a delay from when the test module 14 generates the fail timing signal till when the test module 14 outputs it to the return system circuit 40. The offset delay of the return system circuit 40 may be a delay from when the fail timing signal is inputted to the return system circuit 40 till when it is outputted when the return signal selecting section 44 selects the fail timing signal output by the first flip-flop 42. The module information storage section 104 also stores these delays.

Then, based on these values, the control section 12 controls the timing with which each return system circuit 40 outputs the fail timing signal so that the timing with which the respective fail timing signals output by the plurality of test modules 14 are inputted to the timing supply section 30 is practically equalized. Similarly to the case explained with reference to FIG. 3, the timing with which the fail timing signal is inputted to the timing supply section 30 is determined by 1) the offset delay in the corresponding return system circuit 40, 2) a transmission delay in the whole system such as a signal line, 3) the test module delay in the test module 14 and 4) the delay set for the return system circuit 40. The delays from 1) to 4) in this case correspond to the delays from 1) to 4) explained with reference to FIG. 3. As explained with reference to FIG. 3, the control section 12 determines the delay to be set for the return system circuit 40 based on the delays from 1) to 3). The control section 12 may store the setting of the delay in the register 65.

The test apparatus 100 described above can practically equalize the output timing of the output signals of the respective test modules 14 readily even when the plurality of types of test modules 14 is used in parallel and even when the configuration of the test module 14 and others is changed. That is, the highly general-purpose test apparatus 100 enables the output timing of the respective test modules 14 to be readily and practically equalized.

Figure 9:
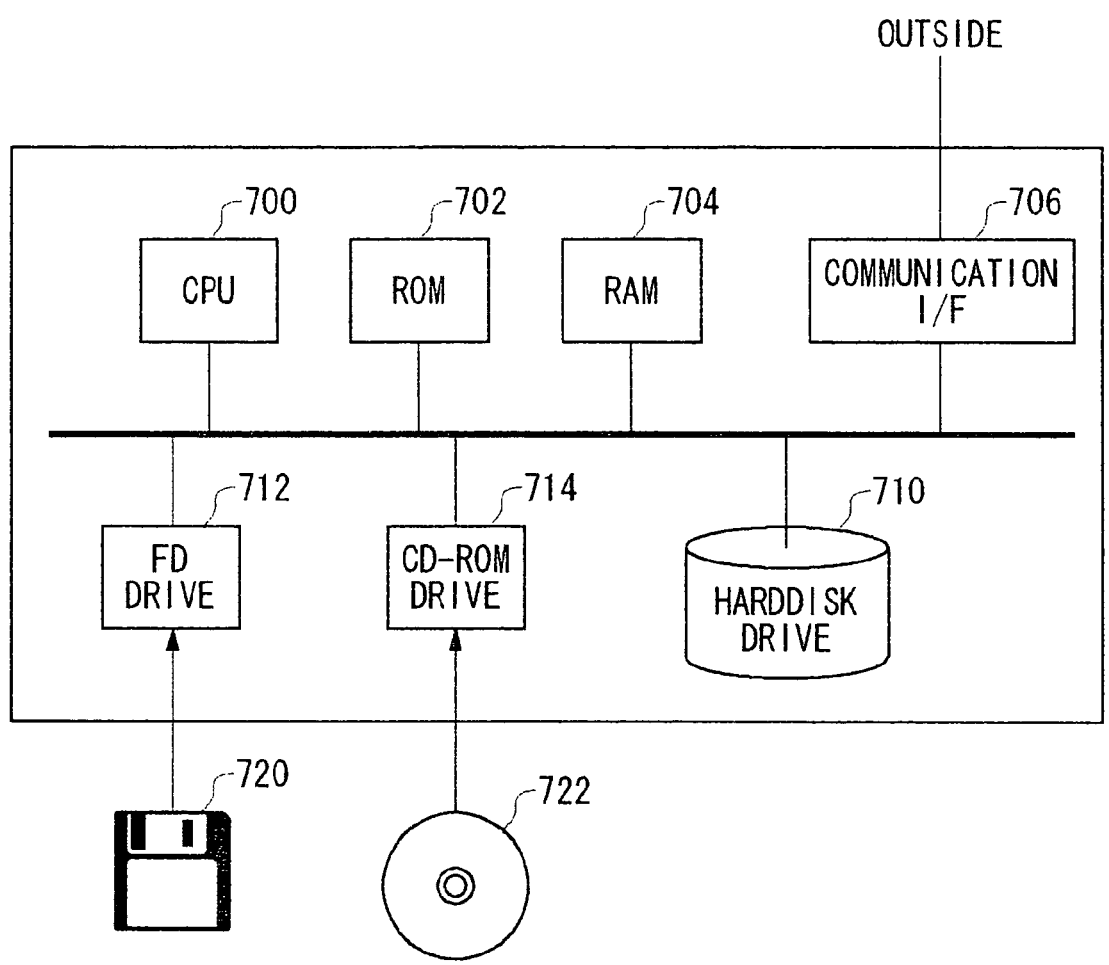
FIG. 9 is a diagram showing one exemplary configuration of a computer in which a program for operating the test apparatus is stored.

FIG. 9 is a diagram showing one exemplary configuration of the computer 300 in which a program for operating the test apparatus 100 is stored. In the present embodiment, the computer 300 stores the program for operating the test apparatus 100 as described with reference to FIGS. 1 through 8. The computer 300 may be a workstation for controlling the test apparatus 100 or may function as the control section 12.

The computer 300 has a CPU 700, a ROM 702, a RAM 704, a communication interface 706, a hard disk drive 710, an FD drive 712 and a CD-ROM drive 714. The CPU 700 operates based on the program stored in the ROM 702, the RAM 704, the hard disk 710, an FD disk 720 and/or a CD-ROM 722.

The communication interface 706 communicates with the test apparatus 100 for example to receive/send data. The hard disk drive 710 as one example of a storage device stores set information and the program for operating the CPU 700. The ROM 702, the RAM 704, and/or the hard disk drive 710 store the program for causing the test apparatus 100 to function as explained with reference to FIGS. 1 through 8.

The program may be stored in the flexible disk 720, the CD-ROM 722, the hard disk drive 710 or the like.

The FD drive 712 reads the program from the flexible disk 720 and provides it to the CPU 700. The CD-ROM drive 714 reads the program from the CD-ROM 722 and provides it to the CPU 700.

The program may be read directly from the recording medium to the RAM to be executed or may be read by the RAM to be executed after being installed once in the hard disk drive. Still more, the program may be stored in a single recording medium or in a plurality of recording media. The program stored in the recording medium may provide the respective functions in cooperation with an operating system. For instance, the program may be what depends on the operating system in executing a part or whole of the functions or what provides the functions based on a response from the operating system.

As the recording medium for storing the program, optical recording media such as DVD, PD or the like, opt-magnetic recording media such as MD, tape medium, magnetic recording medium, semiconductor memory such as IC card and miniature card may be used beside the flexible disk and the CD-ROM. Still more, a storage device such as a hard disk and RAM provided in a server system connected with a dedicated communication network and Internet may be used as the recording medium.

As it is apparent from the above explanation, the invention allows the output timing of the respective test modules to be readily and practically equalized in the test apparatus having such high general-purposeness.

Although the invention has been described by way of exemplary embodiments, it should be understood that those skilled in the art might make many changes and substitutions without departing from the spirit and the scope of the invention. It is obvious from the definition of the appended claims that the embodiments with such modifications also belong to the scope of the invention.

What is claimed is:

1. A test apparatus for testing DUTs, comprising:
   a plurality of test modules for supplying test patterns used in testing said DUTs to said DUTs corresponding to a given timing signal;
   a reference clock generating section for generating a reference clock;
   a plurality of timing supply sections, provided corresponding to said plurality of test modules, for generating the timing signal corresponding to the reference clock and supplying the timing signal to said corresponding test modules, respectively; and
   a control section electrically connected to the plurality of timing supply sections, wherein the control section supplies control signals to the plurality of timing supply sections, and controls timing for outputting the timing signal output by said timing supply sections so that timings of said respective test patterns output by said plurality of test modules are practically equalized based on a test module delay of said respective test modules until when they output the test pattern after receiving the timing signal.

2. The test apparatus as set forth in claim 1, wherein said timing supply section has a delay circuit section for generating the timing signal by delaying the reference clock; and
   said control section controls a delay set value in each delay circuit section based on the test module delay of said respective test modules and on an offset delay of said delay circuit section corresponding to said test module.

3. A test apparatus for testing DUTs, comprising:
a plurality of test modules for supplying test patterns used in testing said DUTs to said DUTs corresponding to a given timing signal;
a reference clock generating section for generating a reference clock;
a plurality of timing supply sections, provided corresponding to said plurality of test modules, for generating the timing signal corresponding to the reference clock and supplying the timing signal to said corresponding test modules, respectively; and
a control section for controlling timing for outputting the timing signal output by said timing supply sections so that timings of said respective test patterns output by said plurality of test modules are practically equalized based on a test module delay of said respective test modules until when they output the test pattern after receiving the timing signal,
wherein said timing supply section has
a delay circuit section for generating the timing signal by delaying the reference clock; and
said control section controls a delay set value in each delay circuit section based on the test module delay of said respective test modules and on an offset delay of said delay circuit section corresponding to said test module,
wherein said control section has
a system configuration storage section for storing system configuration information specifying types of said respective test modules and types of said timing supply section corresponding to each test module in advance;
a module information storage section for storing said test module delay per type of said test module and said offset delay per type of said timing supply section; and
an operating section for detecting the test module delay of each test module and the offset delay of said timing supply section corresponding to said test module from said module information storage section based on said system configuration information stored in said system configuration storage section and for calculating the delay set value to be set in each delay circuit section based on the detected test module delay and offset delay.

4. The test apparatus as set forth in claim 3, wherein said operating section calculates the delay set value to be set in each delay circuit section based further on a wiring delay in a wire connecting each test module with said timing supply section corresponding to said test module.

5. The test apparatus as set forth in claim 4, wherein said delay circuit section has
a plurality of cascade-connected flip-flops for receiving the timing signal and passing it sequentially to the next stage corresponding to the reference clock;
a timing signal selecting section for receiving the timing signals output by said respective flip-flops and for selecting either one among said plurality of received timing signals to supply to said test module; and
said operating section calculates the delay set value for controlling the selection of said corresponding timing signal selecting section that selects either one of the timing signals per each test module.

6. The test apparatus as set forth in claim 3, wherein said delay circuit section has a plurality of cascade-connected flip-flops for receiving the timing signal and passing it sequentially to the next stage corresponding to the reference clock; and
a timing signal selecting section for receiving the timing signals output by said respective flip-flops and for selecting either one among said plurality of received timing signals to supply to said test module; and
said operating section calculates the delay set value for controlling the selection of said corresponding timing signal selecting section that selects either one of the timing signals per each test module.

7. The test apparatus as set forth in claim 6, wherein said control section has also a delay setting section for controlling the selection of each timing signal selecting section that selects either one of the timing signals based on each delay set value.

8. The test apparatus as set forth in claim 7, wherein said delay setting section judges to which test module said timing supply section corresponds based on the system configuration information and sets the delay set value calculated by said operating section per each test module to said timing supply section corresponding to each test module.

9. The test apparatus as set forth in claim 3, wherein each of said test modules has a plurality of test pattern paths for outputting said test patterns;
each of said timing supply sections has said delay circuit section per each test pattern path of said corresponding test module; and
said control section controls the delay set value in each of said delay circuit section based on the test module delay in said corresponding test pattern path.

10. The test apparatus as set forth in claim 9, wherein said module information storage section stores the test module delay per each test pattern path of said respective test modules; and
said operating section detects the test module delay per each test pattern path of each test module and the offset delay of said timing supply section corresponding to said test module from said module information storage section and calculates said delay set value to be set in each delay circuit section based on the detected test module delay and the offset delay.

11. The test apparatus as set forth in claim 3, wherein said operating section calculates a delay set value to be set in each delay circuit section anew based on changed system configuration information when said system configuration information stored in said system configuration storage section is changed.

12. A computer readable medium containing instructions for operating a test apparatus for testing DUTs as:
a plurality of test modules for supplying test patterns used in testing said DUTs to said DUTs corresponding to a given timing signal;
a reference clock generating section for generating a reference clock;
a plurality of timing supply sections, provided corresponding to said plurality of test modules, for generating the timing signal corresponding to the reference clock and supplying the timing signal to said corresponding test module, respectively; and
a control section electrically connected to the plurality of timing supply sections, wherein the control section supplies control signals to the plurality of timing supply sections, and controls timing for outputting the timing signals output by said timing supply sections so that timing of said respective test patterns output by said plurality of test modules is practically equalized based on a test module delay of each test module until when it outputs the test pattern after receiving the timing signal.

13. A test apparatus for testing DUTs, comprising:

a plurality of test modules for supplying test patterns used in testing said DUT to said DUT corresponding to a given timing signal and for generating a fail timing signal specifying whether or not said DUT is non-defective based on an output signal of said DUT;

a reference clock generating section for generating a reference clock; a plurality of timing supply sections, provided corresponding to said plurality of test modules, for generating the timing signal corresponding to the reference clock and supplying the timing signal to said corresponding test module, respectively;

a plurality of return system circuits, provided in correspondence to said plurality of test modules, for receiving said fail timing signal output by said corresponding test module, delaying and inputting the fail timing signal to said timing supply section and generating the timing signal corresponding to the fail timing signal; and a control section for controlling timing of each of said return system circuit in outputting said fail timing signal so that timing when each fail timing signal output by said plurality of test modules is inputted to said timing supply section is practically equalized based on the test module delay of each test module until when it outputs the fail timing signal to said return system circuit after generating the fail timing signal.

14. The test apparatus as set forth in claim 13, wherein said return system circuit has a delay circuit section for delaying and outputting the fail timing signal; and said control section controls a delay set value in each of said delay circuit sections based on the test module delay of each of said test modules and on an offset delay of said delay circuit section corresponding to said test module.

15. A computer readable medium containing instructions for operating a test apparatus for testing DUTs as:

a plurality of test modules for supplying test patterns used in testing said DUT to said DUT corresponding to a given timing signal and for generating a fail timing signal specifying whether or not said DUT is non-defective based on an output signal of said DUT;

a reference clock generating section for generating a reference clock;

a plurality of timing supply sections, provided corresponding to said plurality of test modules, for generating the timing signal corresponding to the reference clock and supplying the timing signal to said corresponding test module, respectively;

a plurality of return system circuits, provided in correspondence to said plurality of test modules, for receiving the fail timing signal output by said corresponding test module, delaying and inputting the fail timing signal to said timing supply section and generating the timing signal corresponding to the fail timing signal; and a control section for controlling timing of each of said return system circuit in outputting the fail timing signal so that timing when each fail timing signal output by said plurality of test modules is inputted to said timing supply section is practically equalized based on the test module delay of each test module until when it outputs the fail timing signal to said return system circuit after generating the fail timing signal.

* * * * *